United States Patent [19]

Kaplan et al.

[11] Patent Number: 4,508,590
[45] Date of Patent: Apr. 2, 1985

[54] METHOD FOR THE DEPOSITION OF HIGH-QUALITY CRYSTAL EPITAXIAL FILMS OF IRON

[76] Inventors: Raphael Kaplan, 2347 N. Quantico St., Arlington, Va. 22205; Nicholas Bottka, 5642 Mt. Burnside Way, Burke, Va. 22015

[21] Appl. No.: 532,938

[22] Filed: Sep. 16, 1983

[51] Int. Cl.³ .............................................. C30B 23/02
[52] U.S. Cl. .................................. 156/601; 156/611; 156/612; 156/DIG. 74; 156/DIG. 113; 422/247; 118/729
[58] Field of Search .............. 156/601, 610, 611, 612, 156/DIG. 74, DIG. 113, 613; 422/247; 118/665, 719, 729, 730; 423/416, 417

[56] References Cited

U.S. PATENT DOCUMENTS

| | | |
|---|---|---|
| 2,754,259 | 7/1956 | Robinson et al. ................... 156/610 |
| 3,158,511 | 11/1964 | Robillard ............................ 156/601 |
| 3,254,953 | 6/1966 | Werner ............................... 423/417 |
| 3,514,320 | 5/1970 | Vaughan ............................ 156/610 |
| 3,749,383 | 7/1973 | Voigt et al. ........................ 118/729 |
| 3,892,490 | 7/1975 | Uetsuki et al. ..................... 156/601 |
| 3,992,233 | 11/1976 | Farrow ............................... 156/612 |
| 4,066,481 | 1/1978 | Manasevit et al. ................. 148/174 |
| 4,147,573 | 4/1979 | Morimoto .......................... 156/610 |
| 4,201,152 | 5/1980 | Luscher ............................. 118/729 |
| 4,330,360 | 5/1982 | Kubiak et al. ..................... 156/610 |
| 4,434,025 | 2/1984 | Robillard ........................... 156/601 |

FOREIGN PATENT DOCUMENTS

| | | | |
|---|---|---|---|
| 15031 | 2/1981 | Japan ............................... | 156/610 |
| 106115 | 7/1982 | Japan ............................... | 156/601 |

*Primary Examiner*—David L. Lacey
*Attorney, Agent, or Firm*—Robert F. Beers; William T. Ellis; Charles E. Krueger

[57] ABSTRACT

A method for forming a single crystal epitaxial film of a selected metal on the surface of a substrate. The method includes the steps of positioning the substrate in an ultra high vacuum environment and exposing the substrate surface to a metalorganic vapor including ions of the selected metal while maintaining an ultra high vacuum environment.

15 Claims, 1 Drawing Figure

METHOD FOR THE DEPOSITION OF HIGH-QUALITY CRYSTAL EPITAXIAL FILMS OF IRON

BACKGROUND OF THE INVENTION

1. Field of the Invention

The invention relates generally to forming a thin metal film on a substrate and more particularly to forming a single crystal epitaxial metal film on a substrate.

2. Description of the Prior Art

There is a growing class of devices that require thin, high quality, single crystal epitaxial films of iron or other metals for their operation. Examples include magnetic or bubble memory devices, magneto-optical switches and microwave terminators.

In order to form a single crystal epitaxial metal film the crystal structure of the substrate surface must be of very high quality. This surface quality of the substrate is determined by an examination utilizing Auger spectroscopic and low energy electron diffraction (LEED) techniques. Subsequent to the forming of the film its crystallinity must be examined by these same examination techniques to determine whether the film has formed into a single crystal. These examining techniques must be performed in an ultra high vacuum environment to be effective. If the film were removed from the vacuum prior to examination the introduction of contaminants would degrade the quality of the film and reduce the accuracy of the examining techniques.

Presently, these single crystal epitaxial metal films are formed in a high vacuum chamber by molecular beam epitaxy (MBE). The examination of the substrate and metal film is carried out in-situ without breaking vacuum. However, the MBE method of forming the metal films is very slow and only suitable for substrates with a small surface area.

Another method for depositing metal films is metal-organic chemical vapor deposition (MOCVD). The standard MOCVD method is performed by introducing a metalorganic vapor into a carrier gas and exposing a heated substrate to the metalorganic vapor-carrier gas mixture. This method is faster than MBE and more effective with large area substrates. However, the method is not performed in a high vacuum environment due to the presence of the carrier gas. Thus, the standard MOCVD method does not allow in-situ characterization of the deposited metal film by such means as Auger and LEED analysis.

OBJECTS OF THE INVENTION

Accordingly, it is an object of the present invention to decrease the time required to form a single crystal epitaxial metal films.

It is a further object of the present invention to increase the substrate area upon which a single crystal epitaxial metal film may be formed.

It is still a further object of the invention to facilitate the in-situ examination of the substrate and deposited film for crystallinity and purity.

SUMMARY OF THE INVENTION

The above and other objects are achieved in the present invention which is a method for forming a single crystal epitaxial film of metal on a substrate utilizing metalorganic chemical vapor deposition (MOCVD) in an ultra-high vacuum environment.

In one embodiment of the invention, the substrate is positioned in an ultra high vacuum main chamber and examined for purity and crystallinity. The examined substrate is then placed in a high-vacuum growth chamber, extending into the main chamber, and exposed to a metal organic vapor including ions of a first metal to form a film of the first metal on the surface of the substrate. The substrate is heated to the deposition temperature of the vapor. During this exposure step the pressure in the main chamber is maintained at less than about $10^{-5}$ Torr. Finally the crystallinity and purity of the film are determined by in-situ Auger spectroscopy and LEED analysis. This determination is made possible by the maintenance of the UHV environment throughout the deposition process.

The method of the invention utilizes the MOCVD characteristics of speed and suitability for large area substrates while maintaining the high vacuum required to examine the purity and crystalinity of the substrate and the metal film.

BRIEF DESCRIPTION OF THE DRAWING

A more complete appreciation of the invention and many of the attendant advantages thereof will be readily obtained as the same becomes better understood by reference to the following detailed description when considered in connection with the accompanying drawing, wherein.

DESCRIPTION OF THE PREFERRED EMBODIMENTS

Figure 1:
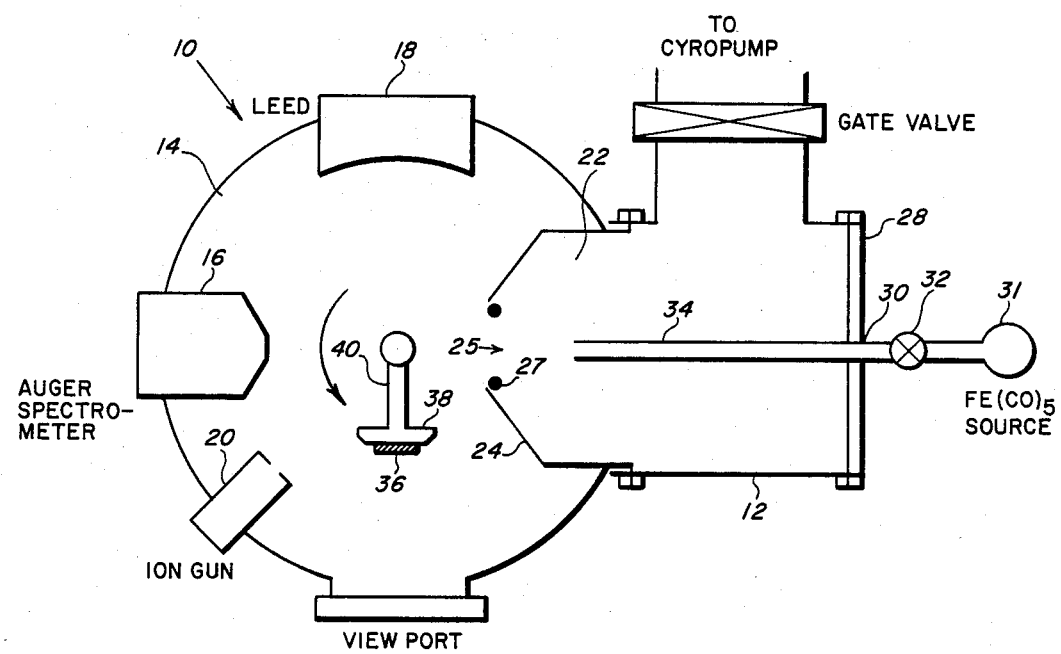
FIG. 1 is a schematic diagram, in top plan, of an apparatus utilized to practice the method of the invention.

The invention is a method for forming a single crystal epitaxial metal film on the surface of a substrate.

Referring now to FIG. 1, a schematic diagram of an apparatus utilized to practice one exemplary embodiment of the method of the invention is presented. The apparatus includes a conventional ultra-high vacuum (UHV) ion pumped stainless steel surface research bell jar 10 altered by the addition of a five inch diameter cylinder 12 extending horizontally several inches into the main chamber 14 of the bell jar 10. The main chamber 14 has UHV instruments such as Auger and low energy electron diffraction (LEED) spectrometers 16 and 18 and an ion gun 20 positioned therein.

The interior of the cylinder 12 extending into the main chamber 14 serves as a growth chamber 22 for forming the metal film. A first end 24 of the cylinder 12 extending into the main chamber 14 is closed except for a one inch diameter orifice 25 containing a viton o-ring 27. A second end 28 of the cylinder includes a gas entry port 30. The metalorganic vapor is admitted from a source 31 into the growth chamber 22 by a leak valve 32 opening into a ¼ inch diameter tube 34 positioned in the gas entry port 30. The growth chamber 22 is separately evacuated by a cryogenic pump.

A substrate 36 is mounted on an indirectly heated substrate holder 38 located in the main chamber 14. The substrate holder 38 is mounted on a conventional specimen manipulator 40 so that its position within the main chamber 14 may be changed. The substrate holder 38 has a bevelled edge designed to seat against the o-ring 27 when the substrate holder 38 is positioned in the orifice 25 by the speciment manipulator 40 to close the growth chamber 22. In this closed position a pressure differential of $10^3$ can be maintained between the growth chamber 22 and the main chamber 14.

In an actual exemplary experiment the following steps were utilized to form a single crystal iron film on a gallium arsenide (GaAs) substrate.

First the substrate 36 was mounted on the substrate holder 38 and the chambers 14 and 22 were evacuated. The substrate 36 was then cleaned by ion bombardment and examined for purity and crystallinity by Auger spectroscopy and LEED. Next, the substrate 36 was positioned against the o-ring 27 orifice 25 to close the growth chamber 22. The substrate 36 was then heated to the deposition temperature, $T_D$, of iron pentacarbonyle which is about 200° C. and exposed to a vapor of iron pentacarbonyl, $Fe(CO)_5$, admitted into the growth chamber 22 thru the $\frac{1}{4}$ inch tube 34, to form a single crystal epitaxial iron film on the surface of the substrate 36. The deposition temperature may assume a range of values over which the molecules of the metalorganic vapor interact with the surface of the substrate to form a metal film. The pressure maintained in the growth chamber 22 is less than about $10^{-5}$ Torr. Since the pressure differential between the main chamber 14 and the growth chamber 22 is $10^3$, the pressure in the main chamber 14 never rose above $10^{-8}$ Torr. Thus, the UHV instruments 16 and 18 in the main chamber 14 may be utilized to perform an in-situ examination of film for purity and crystallinity during or upon completion of the formation process. This examination is required to determine whether the deposited film is in the form of a single crystal.

The methods described above may be utilized to form films of other metals, e.g. nickel, chromium, tungsten or tin, in place of iron by utilizing appropriate metalorganic vapors. The deposition temperature, $T_D$, for these vapors is easily ascertained by persons of ordinary skill in the art. Additionally, other substrate materials which provide a better lattice match with deposited film may be substituted for GaAs. Examples include silicon, germanium, sapphire, sodium chloride, cadmium telluride and indium phosphide.

It is understood that modifications of the above-described apparatus would be obvious to person skilled in the art apprised of the teachings disclosed herein. This apparatus has been described to enable persons skilled in the art to practice the invention and does not limit the scope of the invention defined by the claims.

What is claimed and desired to be secured by Letters Patent of the United States is:

1. A method for forming a single crystal epitaxial film on the surface of a substrate, said method comprising the steps of:
   positioning said substrate in an ultra-high vacuum (UHV) chamber wherein an ultra-high vacuum environment is maintained;
   selecting a metalorganic vapor including ions of a first metal, said vapor having a deposition temperature $T_D$;
   positioning a surface of said substrate at an entrance, within said UHV chamber, to a growth chamber, to approximately seal said entrance;
   heating said substrate to about $T_D$;
   exposing the surface of said heated substrate to said metalorganic vapor in said growth chamber to deposit a single crystal epitaxial film of said first metal upon the surface of said substrate while maintaining the ultra-high vacuum in said UHV chamber; and
   positioning said exposed surface of said substrate within said UHV chamber but away from said growth chamber entrance to facilitate examination in an ultra-high vacuum environment.

2. The method of claim 1 including the step of:
   examining said substrate for crystallinity and purity prior to said exposing step.

3. The method recited in claim 2 including the step of:
   examining said film for crystallinity and purity subsequent to said exposing step.

4. The method recited in claim 3 including the step of:
   cleaning said substrate by ion bombardment prior to said step of examining said substrate.

5. The method recited in claim 4 wherein said steps of examining said substrate and said film includes the steps of:
   performing Auger spectorscopy and low energy electron diffraction analyses.

6. The method recited in claim 5 further including the step of:
   selecting said metalorganic vapor to be iron penta carbonyl, $Fe(CO)_5$.

7. The method recited in claim 5 including the step of:
   selecting said first metal from the group consisting of nickel, chromium, tungsten and tin.

8. The method recited in claim 5 including the step of:
   selecting said substrate to be gallium arsenide (GaAs).

9. The method recited in claim 5 including the step of:
   selecting said substrate from the group consisting of silicon, germanium, sapphire, sodium chloride, cadmium telluride, and indium phosphide.

10. A method for forming a single crystal metal film on the surface of a substrate, said method being performed in an ultra high vacuum (UHV) system including a main chamber and a growth chamber formed by the interior of a metal tube extending into the main chamber, where the growth chamber includes a first end, extending into the main chamber, that is closed except for a small orifice, and also includes a second end with an input port for receiving a metalorganic vapor, said UHV system also including a bevelled substrate holder, with the substrate mounted thereon, of dimensions suitable for closing said orifice when positioned therein, said method comprising the steps of:
    cleaning said substrate;
    examining said cleaned substrate for purity and crystallinity;
    positioning said substrate holder in said orifice to close said orifice and to position said cleaned and examined substrate within said growth chamber;
    selecting a metalorganic vapor including ions of a first metal, said vapor with a deposition temperature $T_D$;
    heating said substrate to about $T_D$;
    admitting said metalorganic vapor into said growth chamber while maintaining the UHV environment in said main chamber to expose said cleaned, examined, and heated substrate to said metalorganic vapor and to form a single crystal epitaxial film of said first metal on the surface of said substrate;
    positioning said substrate holder in said main chamber and examining said film of said first metal for crystallinity and purity.

11. The method recited in claim 10 wherein said steps of examining said substrate and said film includes the steps of:
    performing Auger spectroscopy and low energy electron diffraction analyses.

12. The method recited in claim 10 further including the step of:

selecting said metalorganic vapor to be iron penta carbonyl, $Fe(CO)_5$.

13. The method recited in claim 10 including the step of:

selecting said first metal from the group consisting of nickel, chromium, tungsten and tin.

14. The method recited in claim 10 further including the step of:

selecting said substrate to ba gallium arsenide (GaAs).

15. The method recited in claim 10 including the step of:

selecting said substrate from the group consisting of silicon, germanium, sapphire, sodium chloride, cadmium telluride, and indium phosphide.

* * * * *